United States Patent
Tang et al.

(10) Patent No.: US 6,483,967 B2
(45) Date of Patent: Nov. 19, 2002

(54) OPTICAL WAVEGUIDE COUPLER FOR INTERCONNECTION OF ELECTRO-OPTICAL DEVICES

(75) Inventors: Suning Tang, Fremont, CA (US); Ray T. Chen, Austin, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 09/893,197

(22) Filed: Jun. 27, 2001

(65) Prior Publication Data

US 2002/0012501 A1 Jan. 31, 2002

Related U.S. Application Data

(63) Continuation of application No. 09/205,445, filed on Dec. 4, 1998.

(51) Int. Cl.[7] .............................. G02B 6/26; G02B 6/42
(52) U.S. Cl. .............................. 385/43; 385/14; 385/31; 385/131; 385/132
(58) Field of Search ............................. 385/14, 28, 31, 385/43, 49, 130, 129, 131, 132; 437/126

(56) References Cited

U.S. PATENT DOCUMENTS

| | | | |
|---|---|---|---|
| 4,643,519 A | 2/1987 | Bussard et al. | 350/96.19 |
| 4,773,063 A | 9/1988 | Hunsperger et al. | 370/3 |
| 4,813,756 A | 3/1989 | Frenkel et al. | 350/96.18 |
| 4,926,412 A | 5/1990 | Jannson et al. | 370/3 |
| 5,026,131 A | 6/1991 | Jannson et al. | 350/3.7 |
| 5,029,967 A | 7/1991 | Livezey et al. | 350/96.19 |
| 5,228,103 A | 7/1993 | Chen et al. | 385/14 |
| 5,278,687 A | 1/1994 | Jannson et al. | 359/125 |
| 5,332,690 A * | 7/1994 | Cho et al. | 437/126 |
| 5,402,511 A | 3/1995 | Malone et al. | 385/43 |
| 5,473,710 A | 12/1995 | Jaw et al. | 385/14 |
| 5,493,393 A | 2/1996 | Beranek et al. | 356/328 |
| 5,555,330 A | 9/1996 | Pan et al. | 385/39 |
| 5,682,255 A | 10/1997 | Friesem et al. | 359/15 |
| 5,703,974 A | 12/1997 | Sasaki et al. | 385/14 |
| 5,777,763 A | 7/1998 | Tomlinson, III | 359/130 |
| 5,796,479 A | 8/1998 | Derickson et al. | 356/326 |
| 5,917,625 A | 6/1999 | Ogusu et al. | 359/130 |
| 5,970,190 A | 10/1999 | Fu et al. | 385/37 |
| 5,999,672 A | 12/1999 | Hunter et al. | 385/37 |
| 6,003,222 A | 12/1999 | Barbarossa | 29/600 |
| 6,052,397 A * | 4/2000 | Jeon et al. | 372/46 |
| 6,181,860 B1 * | 1/2001 | Granestrand et al. | 385/129 |

OTHER PUBLICATIONS

LtCol David Honey and Robert Leheny, "Steered Agile Beams Workshop Proceedings Book", DARPA: *Conference Material*, Mar. 24–25, 1999.

(List continued on next page.)

Primary Examiner—Frank G. Font
Assistant Examiner—Michael P Mooney
(74) Attorney, Agent, or Firm—Gary Cary Ware & Freidenrich LLP (57) ABSTRACT

The present invention is a three-dimensional tapered waveguide coupler capable of interconnecting electro-optical devices with differing optical mode profiles. The ends of the waveguide are configured to match the optical mode profiles of the electro-optical devices that the waveguide interconnects. The waveguide adiabatically transmits the fundamental mode of the photo-optic signal from the electro-optical device at the waveguide's input end to a different electro-optical device at the waveguide's output end. A single coupler can be configured with one or more waveguides, each waveguide having different optical mode profiles at either end and different optical transmission characteristics.

8 Claims, 4 Drawing Sheets

OTHER PUBLICATIONS

Richardson Grating Laboratory, "Technical Note 6, Echelle Gratings", <http://www.gratinglab.com/library/techNotes/technote6.asp>, Aug. 23, 1999.

M.C. Huntley, "Diffraction Gratings"; Academic Press, pp. 40–42, 1982.

Tang et al.; "Compression–Molded Three Dimensional Tapered Optical Polymeric Waveguides for Optoelectronic Packaging"; Radiant Research, Inc.:*Article*.

Tang et al.; "Reconfigurable Electro–Optic Interconnects Using Holographic Elements"; Radiant Research, Inc.: *Article*.

Ciena, Fundamentals of DWDM; *pamphlet*.

U.S. Pending patent application Ser. No. 09/405,472: Horwitz, et al.; "System and Method for Wavelength Division Multiplexing and Demultiplexing"; Radiant Research, Inc., Filed Sep. 24, 1999.

U.S. Pending patent application Ser. No. 09/316,323: Davies, et al.; "Holographic Optical for Transmission of Optical Signals"; Radiant Research, Inc., Filed May 21, 1999.

* cited by examiner

OPTICAL WAVEGUIDE COUPLER FOR INTERCONNECTION OF ELECTRO-OPTICAL DEVICES

CROSS REFERENCE TO RELATED APPLICATIONS

This application is a continuation from U.S. patent application Ser. No. 09/205,445, filed by Tang et al. on Dec. 4, 1998 and entitled "COMPRESSION-MOLDED THREE-DIMENSIONAL TAPERED UNIVERSAL WAVEGUIDE COUPLERS"

GOVERNMENTAL RIGHTS

The invention was made with Government support under Contract Nos. F19628-96-C-0088 and F19628-98-C-0040 awarded by Electronic Systems Center, PKR, Air Force Materiel Command, USAF. The Government has certain rights in the invention.

BACKGROUND OF THE INVENTION

1. Field of the Invention

The present invention relates to waveguides, and more specifically to optical waveguide interconnectors.

2. Description of the Related Art

Communications and computing systems based on electronic interconnection schemes have nearly reached their limits of any further improvement, while demands for higher bandwidth and speed are ever increasing for military and civilian applications. This scenario has led researchers to seriously consider new computing architectures based on optoelectronic interconnects. Employment of optical technologies is already a reality in the area of communications. However, full commercial realization of optical computation and communications networks depends on the successful transmission and control of high-speed signals among processing elements, memories and other peripherals with minimal losses. In fact, by now, several key components and manufacturing technologies needed for this technological revolution have attained an appreciable state of maturity. A large variety of optoelectronic devices such as lasers, optical amplifiers, electro-optic switches, modulators, and detectors exhibit excellent performance characteristics. Also, the transmission characteristics achieved for optical waveguides and fibers allow optical transmission spans from intra-wafer interconnection to global optical communications.

The compatibility and reliability aspects of optoelectronic packaging are the major hurdles to taking full advantage of novel achievements in optoelectronic device technology. The difficulty in packaging mismatched discrete optoelectronic components generally results in high coupling losses. The mismatch is mainly a consequence of spatial and angular variations of individual optoelectronic components and separations of array devices. These components, which are often fabricated on different substrates, have different mode sizes, numerical apertures and component separations. For example, laser diodes can be made on GaAs, detectors made on silicon, and modulators made on $LiNbO_3$. The dimensions of these discrete devices are pre-selected to optimize their performance, and vary from a few microns (single-mode waveguides and vertical cavity surface-emitting lasers) to hundreds of microns (photodetectors and multi-mode plastic fibers). The requirements of individual element performance optimization make system integration very difficult with comfortable alignment tolerance, and consequently integration results in high packaging costs. In many scenarios, the packaging cost is approximately 50% of the total system cost. Achieving efficient optical coupling among various devices with sufficient alignment tolerance is particularly difficult when using prisms, gratings, or optical lenses.

Two-dimensional (2-D) tapered waveguides have been employed to improve optical coupling among various optoelectronic devices. Coupling efficiency can be further improved if three-dimensional (3-D) tapered waveguides can be fabricated and employed. However, none of the existing optoelectronics or microelectronics fabrication methods available to optoelectronics industrial sectors is suitable for making satisfactory 3-D tapered waveguide devices, varying from a few microns to hundreds of microns in both horizontal and vertical directions. To grow a high-index waveguide layer hundreds of microns in thickness is impractical using any existing waveguide fabrication method used for inorganic materials such as GaAs, $LiNbO_3$ and glass. The 3-D compression molded polymeric waveguide described herein is a solution to bridge the huge dynamic range of different optoelectronic device-depths varying from a few microns to hundreds of microns.

The ends of the waveguide are designed to provide interfaces with fiber-optic cables. There are three problems that have occurred at the ends, or interfaces, of the waveguide:

(1) inconveniently high coupling loss due to the optical mode mismatch, (2) strict alignment tolerance which makes the packaged system vulnerable to harsh environments, and (3) separation mismatch when array devices (such as laser diode arrays, smart pixel arrays, photodetector arrays and optical fiber/waveguide arrays) are employed.

Due to the planarized nature of these devices mentioned above, the most common approach based on microlenses is bulky and very expensive because it requires complicated three-dimensional spatial and angular alignments.

Conventional optoelectronic packaging technologies have failed to provide low-loss coupling among various optoelectronic devices, including laser diodes, optical modulators, waveguide splinters, single-mode optic fibers, multi-mode optic fibers and optical detectors. The above mentioned three problems are solved by the present invention.

SUMMARY

The present invention discloses an apparatus and method for interconnecting electro-optical devices with differing optical mode profiles. The present invention is a three-dimensional tapered waveguide with a specified index of refraction that adiabatically transmits the fundamental mode of the photo-optic signal from an electro-optical device at the waveguide's input end to a different electro-optical device at the waveguide's output end. The input and output ends of the three-dimensional tapered waveguide are configured to match the optical mode profiles of the electro-optical devices that the waveguide interconnects.

The three-dimensional tapered waveguide can be configured in an array, to interconnect arrays of electro-optical devices with differing optical mode profiles and inter-device separation. Depending upon system packaging requirements, the waveguide can be manufactured on a substrate for interconnecting devices mounted on or near substrates such as printed circuit boards or silicon substrates, or encased in a plug-type arrangement for interconnecting electro-optical devices such as fiberoptic cables. The substrate or encasing material has a different index of refraction than the waveguide material.

Additionally, the present invention comprises a compression-molding technique for fabricating 3-D tapered polymeric waveguides. This embodiment of the present invention comprises a two-piece molding tool that includes a substrate and a mold plunger where the mold plunger provides a cavity having the shape of the desired 3-D-tapered waveguides. The present invention provides an appropriate amount of molding material that is spin-coated or laminated onto the substrate. The film thickness is equal to the maximum thickness of the tapered structure. The molding process begins with the heating of the mold plunger and the polymer film. Then the two parts of the mold are brought together under pressure that causes the polymer film, which is softened by heat, to be compression molded into the shape of the stamp of the desired 3-D-tapered waveguides.

DETAILED DESCRIPTION OF THE INVENTION

The present invention comprises a novel universal optical coupler that comprises a unique three-dimensional tapered polymeric waveguide with different mode-profiles at the two ends that can match to two different optoelectronic devices respectively, for increasing the optical coupling efficiency and the alignment tolerance. These polymeric waveguide couplers are fabricated by the compression-molding technique. Additionally, the present invention also includes a unique compression-molding method for manufacturing three-dimensional tapered polymeric waveguides that comprises a compression step at the polymer phase transition state. Within this step, the 3-D waveguide structure is transferred from the mold plunger into a polymeric film that has been preapplied to any substrate of interest.

The most common approach for optical coupling among optoelectronic devices with different apertures is to employ an optical lens that is often too bulky compared to the optoelectronic devices to be coupled. Such an approach also is very expensive because it requires complicated three-dimensional spatial and angular alignments. Another conventional approach is to employ the two-dimensional tapered waveguide coupler that can be manufactured by standard photolithography technique. The innovative compression-molded three-dimensional polymeric waveguide of the present invention is an effective component for optical coupling among various optoelectronic devices, including laser diodes, optical amplifiers, electro-optic switches, modulators, optic fibers and photodetectors. The novel compression-molded polymeric waveguide is a solution to bridge the huge dynamic range of different optoelectronic components. It is also applicable wherever there is a need to interconnect optoelectronic components with different apertures, such as connecting telecommunication (single-mode) fibers to (multi-mode) local network fibers.

Compression molding is also one of the most effective methods for mass-producing high quality low-cost optical polymeric waveguide devices. The compression molding methodology disclosed herein adds the novel steps of compression molding a material that has been preapplied to a substrate of interest, and performing that compression molding step when the preapplied material is at the polymer transition stage.

The compression-molded three-dimensional universal waveguide couplers are made out of optical polymers that can be compression-molded into optical channel waveguide format for effective optical coupling. The 3-D tapered waveguide coupler has two different optical mode profiles at the two ends. The two different optical mode profiles match the optical mode profiles of two optoelectronic devices to be coupled and increase the optical coupling efficiency between the two devices. The guided region of the 3-D waveguide coupler functions as a guided mode convertor with a very small propagation loss. For optical coupling between two arrays of devices, a waveguide coupler array provides both the different mode profiles at the two output ends and the required channel separations.

The 3-D waveguide coupler can be molded directly onto any substrate of interest. The substrate functions as a structural element, providing physical support for the waveguide during manufacturing and operation. The substrate can also provide a convenient design solution to insure that the optoelectronic devices to be coupled to the waveguide are properly aligned with the waveguide, since such devices are often designed for mounting on typical electronic substrates such as a printed circuit board or a silicon substrate. Alternatively, the 3-D waveguide coupler can be enclosed or encased in a plug-type arrangement that provides the necessary physical support and alignment, and is more convenient for interconnecting electro-optical cables such as fiberoptic cables.

The process of compression-molding involves fabrication of mold plungers with the desired 3-D waveguide cavity, preparation of polymer films on a substrate, and formation of waveguides. A two-piece compression-molding tool consists of a substrate and mold plunger that provides a cavity having the shape of the desired 3-D-tapered waveguide. An appropriate amount of molding polymer, polymer waveguide film in this case, is spincoated or laminated onto the substrate of interest. The film thickness is equal to the maximum thickness of the tapered structure. The molding process begins with the heating of the mold plunger and the polymer film. The two parts of the mold are then brought together under force. The polymer film, softened by heat, is thereby molded into the shape of the stamp. The last step is to harden and fix the molded waveguide shape. The fundamental differences in polymers dictate the plastic processing method to be used for the final step in the waveguide molding. For example, thermosetting polymers are further heated under pressure, while thermoplastics are cooled to room temperature. After the polymer is cured (fixed), the mold plunger is removed, leaving behind are the 3-D-tapered waveguide structures on the substrate.

Figure 1A:
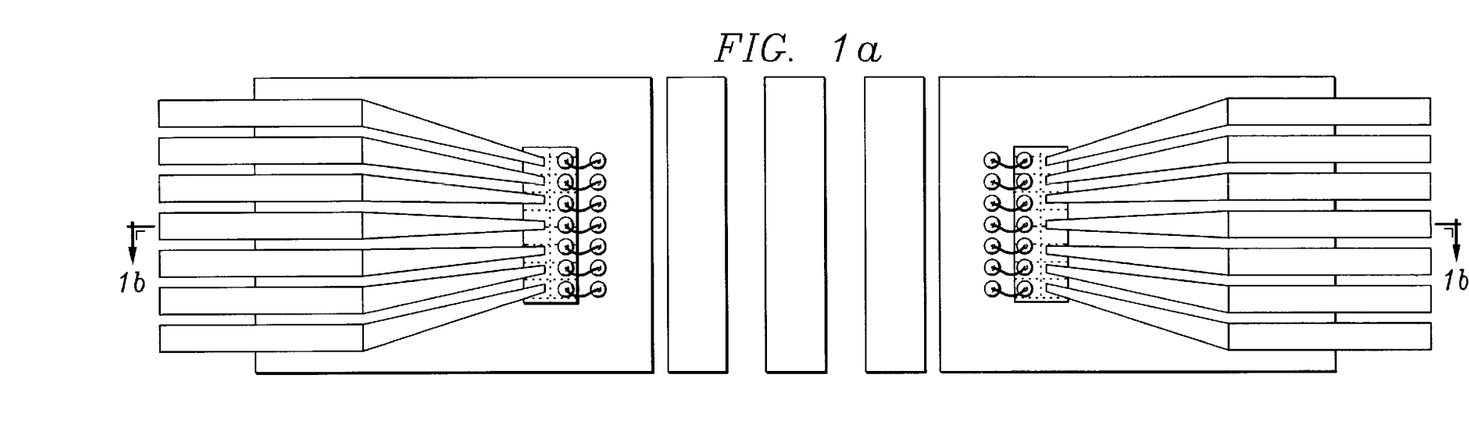
FIG. 1 shows an illustration of an optoelectronic interconnect module where the three-dimensional tapered polymeric waveguide couplers are employed for interconnecting an VCSEL array to an optic fiber array and a photodetector array to an optic fiber array.
Figure 1B:
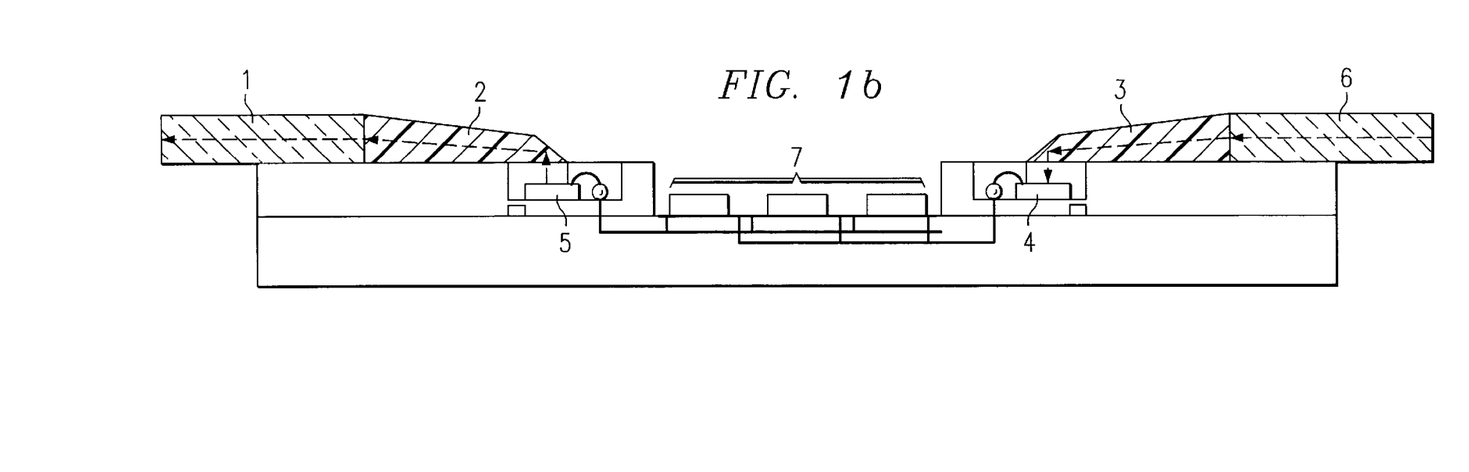
Figure 1C:
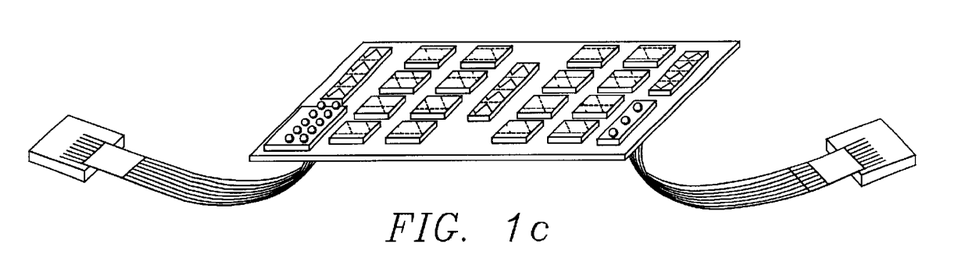

FIG. 1 is an illustration of an optoelectronic interconnect module where the three-dimensional tapered polymeric waveguide couplers are employed for interconnecting a VCSEL array to an optic fiber array and a photodetector array to an optic fiber array. The module shown in FIG. 1 comprises an input optical fiber array 6, 3-D tapered waveguide couplers 2 and 3, photodetectors 4, VCSELs 5, and an output optical fiber array 1, all of which are mounted on any substrate of interest, such as a PC board or silicon substrate with electronics system 7. The incoming photo-optic or light signal from optical fiber array 6 is coupled to the input end of a tapered waveguide array 3 and converted to electrical signals by an array of fast photodetectors 4 at the input-end of the electronic system 7. From the transmission end, the electrical signals from the electronic system 7 are converted to photo-optical signals using an array of VCSELs 5 and then routed to the output fiber array 1 by a tapered waveguide coupler 2 in conjunction with 45° waveguide mirrors 8. Such 45° waveguide mirrors 8 can be molded simultaneously with the 3-D tapered waveguides.

For successful coupling, it is crucial to (a) match the mode profiles at the input end of the tapered waveguides 3 and 2 to the mode profiles of optical fibers 6 and VCSELs 5, respectively; (b) maintain adiabatical propagation of the guided mode through the tapered waveguides 2 and 3; and (c) match the mode profiles at the output ends of tapered waveguides 3 and 2 to the mode profiles of the fast photodetector array 4 and the optical fiber array 1, respectively. Employing the 3-D tapered waveguides allows alignment tolerances to be relaxed and reduces the coupling losses. The 3-D tapered waveguides provide a universal low-loss packaging scheme covering the huge dynamic range of various optoelectronic devices, which have apertures ranging from a few micrometers to hundreds of micrometers. The coupling technique shown in FIG. 1 is not only useful for interconnecting optoelectronic multi-chip modules but also useful for any low-loss device-to-device coupling.

Figure 2:
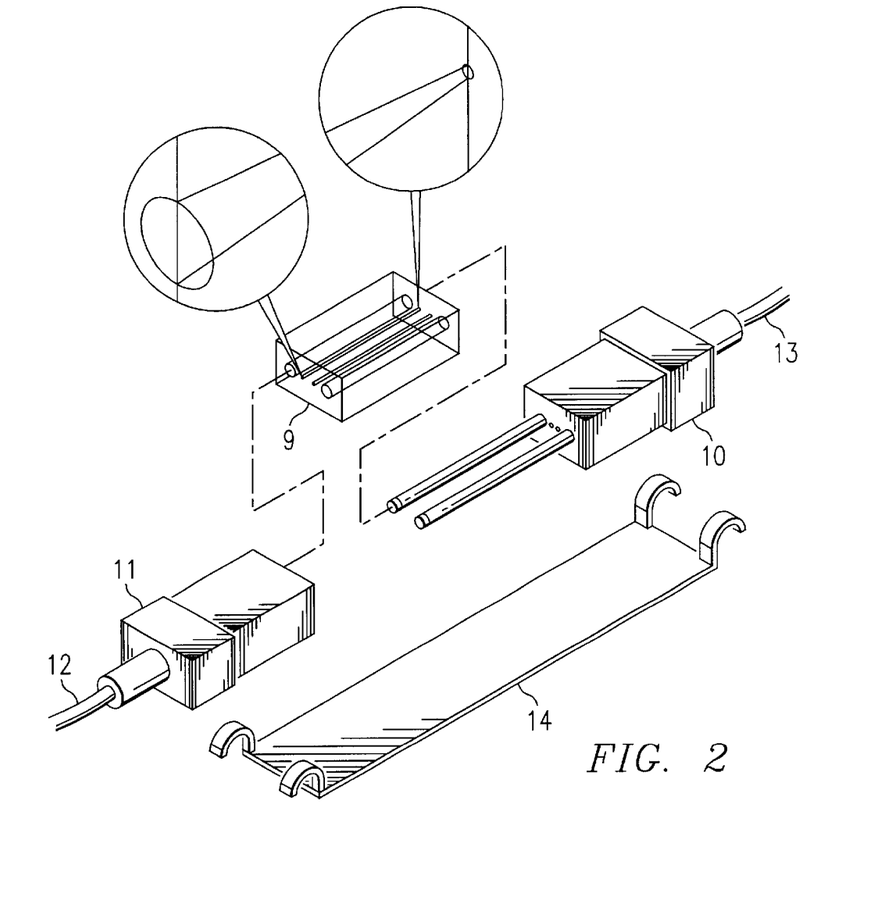
FIG. 2 shows an illustration of an optical fiber MT-type coupler employing three-dimensional tapered polymeric waveguides used for connecting two MT-type fiberoptic connectors that have different mode profiles and fiber separations.
Figure 3A:
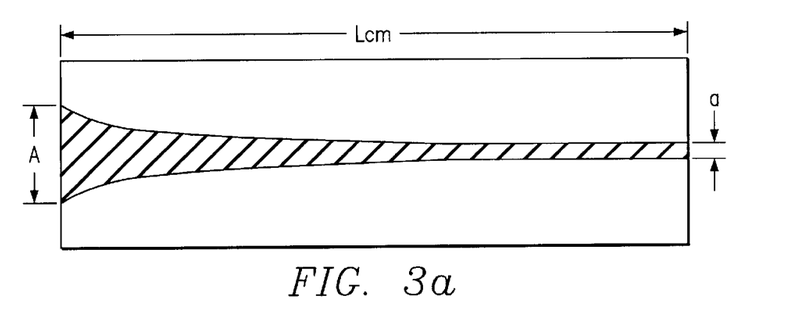
FIG. 3 shows a more detailed illustration of a polymeric waveguide coupler, which comprises an array of 3-D tapered waveguides. Each waveguide has different guided mode profiles at the two ends. The separation between each waveguide may also be different at the two ends in order to match the separation optoelectronic devices under connection.
Figure 3B:
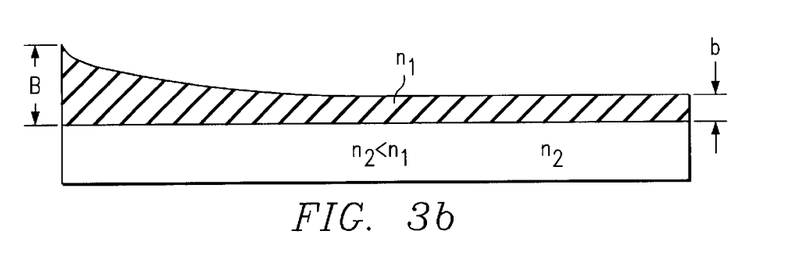
Figure 3C:
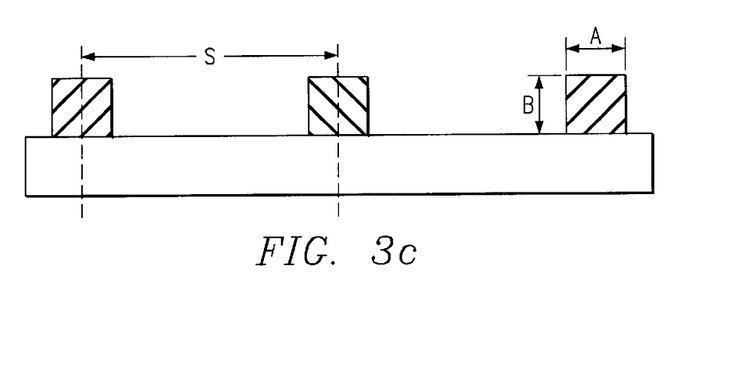
Figure 3D:
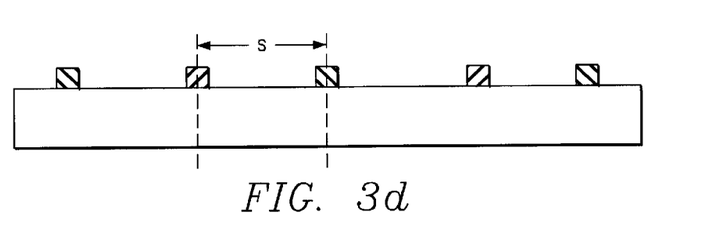

FIG. 2 is an illustration of an optical fiber MT-type coupler 9 for connecting two MT fiberoptic connectors 10 and 11 that have different mode profiles and fiber separations. The MT coupler, comprising the 3-D tapered waveguides, is designed to couple standard single-mode and multi-mode MT-type fiberoptic plugs 10 and 11 with very low insertion loss. Both the single-mode and the multi-mode fiberoptic ribbons 12 and 13 typically have four or eight fibers in an array. A clip 14 can be used to enhance the mechanical reliability of the connection.

FIG. 3 is a more detailed illustration of a polymeric waveguide coupler that comprises an array of 3-D tapered waveguides. The polymeric waveguide coupler can be employed to improve the optical coupling between a single-mode fiber array and a multi-mode fiber array. Each waveguide has different guided mode profiles at its two ends. The separation between each waveguide may also be different at the two ends of the coupler in order to match the separation of optoelectronic devices under connection. All 3-D tapered waveguides are compression-molded at the same time.

FIG. 3 also illustrates the top and side view of the 3-D tapered polymeric waveguide, revealing its basic structure. In FIG. 3, A, B and a, b are the waveguide width and height at the ends of 3-D tapered coupler, respectively. S and s are the waveguide separation at the two ends of coupler. And, $n_1$ is the optical refractive index of polymer and $n_2$ is the refractive index of the substrate. There is a tradeoff in determining the waveguide length L. The waveguide has to be long enough to ensure adiabatic propagation of the guided modes. On the other hand, the length of the waveguide should be minimized to reduce the waveguide propagation loss.

For efficient power-coupling between two different optoelectronic components facilitated by the tapered waveguide couplers, the guided optical mode should propagate adiabatically through the tapered region of the coupler. In other words, the waveguide must operate without any loss and there should not be any power transfer to higher order local modes. Therefore, it is desirable to maintain the lowest order mode in the waveguide without mode conversion to higher order mode or to a radiation mode taking place.

In our analysis, a simplified approach based on the scalar wave equation is employed. We assume that the tapered waveguide can be subdivided into many small waveguide segments labeled by an index $v$, and defined by a refractive index distribution $n^v(x,y)$ independent of $z$. With the notation $$\Phi_m^v(x, y)$$

and $$\beta_m^v$$

for the local normal modes of order m and their associated propagation constants, respectively, the scalar wave equation for segment $v$ reads, $$\left[\frac{\partial^2}{\partial x^2} + \frac{\partial^2}{\partial y^2} + k^2(n^v(x, y))^2\right]\Phi_m^v(x, y) = (\beta_m^v)^2 \Phi_m^v(x, y). \quad (1)$$

Here $k=2\pi/\lambda$ is the free space wave number. In order to calculate the evolution of the field along the tapered waveguide, we note that due to the completeness of the modes, the electric field distribution within each segment can be expressed as $$E^v(x, y, z) = \sum a_m^v(z) \Phi_m^v(x, y). \quad (2)$$

Based on the modes calculated from Eq. (1), the field $$a_m^v(z)$$

propagating along the structure can be described entirely in terms of the complex amplitudes that can be solved by an iteration of two steps using a Fourier analytic approach. First, as long as both $z$ and $z+d$ lie within the same segment $v$, propagation is described by $$a_m^v(z+d) = a_m^v(z)\exp(i\beta_m^v d). \quad (3)$$

Second, the requirement that the electric field be continuous at the interface $z^{v,v+1}$, between two consecutive segments $v$ and $v+1$ leads to a simple relationship between the complex amplitudes $a_1^v + 1(z^{v,v+1})$ and $a_m^v(z^{v,v+1})$, i.e., $$a_1^v + 1(z^{v,v+1}) = a_m^v \langle \Phi_1^v + 1/\Phi_m^v \rangle a_m^v(z^{v,v+1}). \quad (4)$$

Hence, using Eqs. (3) and (4) with the modes $$\Phi_m^v(x, y)$$

and propagation constants $$\beta_m^v$$

obtained from Eq. (1), we can simulate the propagation of the optical field along the tapered sections.

The 3-D-tapered waveguide device is designed as an adiabatic device in which the optical power is predominantly guided by the fundamental mode. By keeping track of the excitation spectrum defined by the field $$a_m^v(z),$$

we can determine where deviations from adiabatic behavior occur. The critical taper slope $$\left(\frac{\partial r}{\partial z}\right)_c$$

for adiabatic operation can be given as $$\left(\frac{\partial r}{\partial z}\right)_c = (\beta_0 - kn_{clad}) \Big/ \left\{ \left( \left|\frac{\partial \phi_0}{\partial z}\right|^2 \right) \right\}^{1/2} \quad (5)$$

where r is the half-width of the waveguide at longitudinal position z, $\beta_0$ is the propagation constant of the fundamental mode $\Phi_0$, $k=2\pi/\lambda$ is the free space wave number and $n_{clad}$ is the cladding refractive index. The solution to Eq. 5 has to be simulated numerically for a tapered waveguide with near-square input and output cross sections.

Figure 4:
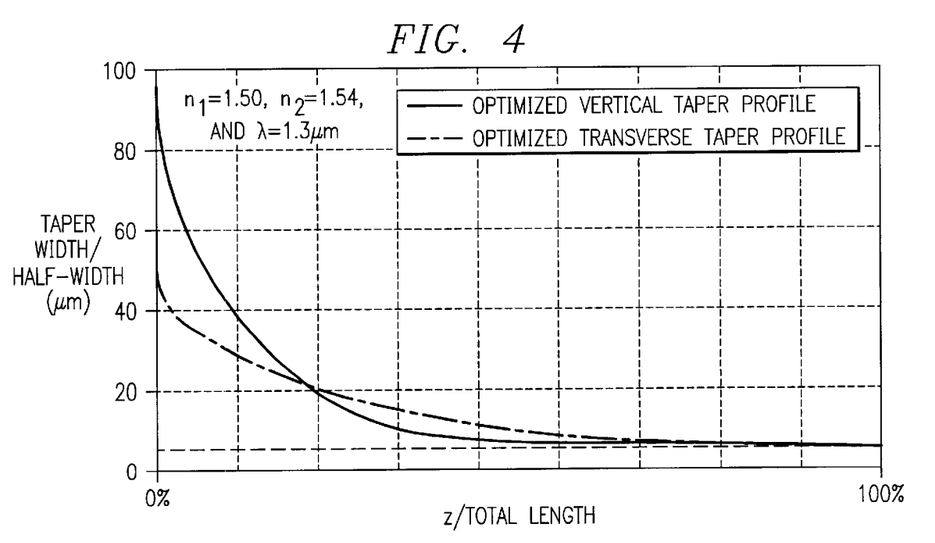
FIG. 4 shows optimized taper profiles for an adiabatic transition of waveguide mode.

FIG. 4 shows the optimized taper profiles that allow an adiabatic transition of a lowest order guided mode propagating along the waveguide taper under certain assumptions. In FIG. 4, the tapered waveguide has a dimension of 5 µm at the small end with single-mode operation, $n_1$ and $n_2$ are the refractive index of polymer and substrate and $\lambda$ is the optical wavelength. In the simulation, $n_1=1.50$, $n_2=1.54$, and $\lambda=1.3$ µm are assumed.

Figure 5A:
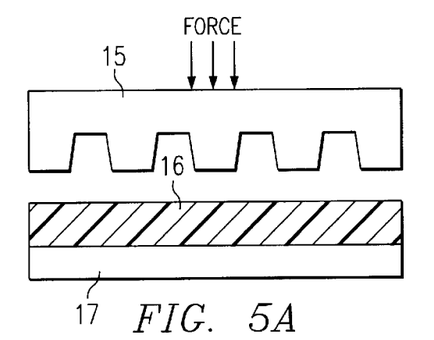
FIG. 5 shows an illustration of the compression-molding technique for fabricating 3-D tapered polymeric waveguides.
Figure 5B:
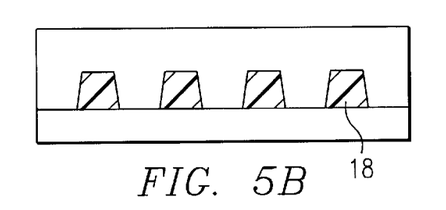

FIG. 5 is an illustration of the compression-molding technique for fabricating 3-D tapered polymeric waveguides. A two-piece molding tool comprising substrate 17 and mold plunger 15 provides a cavity having the shape of the desired 3-D-tapered waveguides 18. An appropriate amount of molding material, polymer waveguide film 16 in this case, is spin-coated or laminated onto the substrate of interest 17. The film thickness is equal to the maximum thickness of the tapered structure. The molding process begins with the heating of the mold plunger 15 and the polymer film 16. Then the two parts of the mold are brought together under pressure. The polymer film 16, softened by heat, is thereby molded (by the compression) into the shape of the stamp. The last step is to harden and fix the molded waveguide shape. This final step depends on the type of polymeric material used. For example, thermosetting polymers are further heated under pressure while the thermoplastics are cooled to room temperature. The fundamental differences in polymers dictate the plastic processing method to be used in the waveguide molding. After the polymer 16 is cured (fixed), the mold plunger 15 is removed. This leaves behind the 3-D-tapered waveguide structures on the substrate. The polymer materials described in this embodiment are exemplary only and non-polymer materials may be substituted without departing from the present invention.

In summary, the present invention is a three-dimensional tapered waveguide coupler capable of interconnecting electro-optical devices with differing optical mode profiles. The ends of the waveguide are configured to match the optical mode profiles of the electro-optical devices that the waveguide interconnects. The waveguide adiabatically transmits the fundamental mode of the photo-optic signal from the electro-optical device at the waveguide's input end to a different electro-optical device at the waveguide's output end. A single coupler can be configured with one or more waveguides, each waveguide having different optical mode profiles at either end and different optical transmission characteristics.

Additionally, the present invention comprises a compression-molding technique for fabricating 3-D tapered polymeric waveguides. This embodiment of the present invention comprises a two-piece molding tool that includes a substrate and a mold plunger where the mold plunger provides a cavity having the shape of the desired 3-D-tapered waveguides. The present invention provides an appropriate amount of molding material that is spin-coated or laminated onto the substrate. The film thickness is equal to the maximum thickness of the tapered structure. The molding process begins with the heating of the mold plunger and the polymer film. Then the two parts of the mold are brought together under pressure that causes the polymer film, which is softened by heat, to be compression molded into the shape of the stamp of the desired 3-D-tapered waveguides.

Other embodiments of the invention will be apparent to those skilled in the art after considering this specification or practicing the disclosed invention. The specification and examples above are exemplary only, with the true scope of the invention being indicated by the following claims.

We claim:

1. An optical waveguide coupler for interconnection of a plurality of electro-optical devices that transfer a photo-optic signal, comprising:

at least one three-dimensional tapered waveguide, having an input end and an output end;

the waveguide configured to transmit the photo-optic signal from the input end to the output end in a transmission direction;

the input end of the waveguide matching the optical mode profile of the electro- optical device transmits the photo-optic signal to the input end;

the output end of the waveguide matching the optical mode profile of the electro- optical device that receives the photo-optic signal from the output end of the waveguide;

a waveguide mirror disposed at the output end of the waveguide for use in directing the photo-optic signal to the electro-optical device that receives the photo-optic signal;

the waveguide mirror disposed at an angle of approximately forty-five degrees relative to the direction of transmission;

a structural member coupled to the waveguide; and the structural member physically supporting the waveguide for proper alignment of the waveguide with the electro-optical devices to be coupled.

2. The optical waveguide coupler of claim 1, further comprising:

a plurality of waveguides, each waveguide within the plurality of waveguides having an input end and an output end and a first index of refraction;

each waveguide within the plurality of waveguides configured to adiabatically transmit a fundamental mode of the photo-optic signal from the respective input end to the respective output end in the transmission direction;

the input end of each waveguide within the plurality of waveguides matching the optical mode profile of the electro-optical device that transmits the photo-optic signal at the respective input end of each waveguide;

the output end of each waveguide within the plurality of waveguides matching the optical mode profile of the electro-optical device that receives the photo-optic signal at the respective output end of each waveguide; and respective waveguide mirrors disposed at the output end of the waveguides.

3. The optical waveguide coupler of claim 1 further comprising the waveguide mirror and the tapered waveguide molded simultaneously.

4. The optical waveguide coupler of claim 1, further comprising:

a plurality of waveguides, each waveguide within the plurality of waveguides having an input end and an output end and a first index of refraction;

each waveguide within the plurality of waveguides configured to adiabatically transmit a fundamental mode of the photo-optic signal from the respective input end to the respective output end in the transmission direction;

the input end of each waveguide within the plurality of waveguides matching the optical mode profile of the electro-optical device that transmits the photo-optic signal at the respective input end of each waveguide;

the output end of each waveguide within the plurality of waveguides matching the optical mode profile of the electro-optical device that receives the photo-optic signal at the respective output end of each waveguide; and respective waveguide mirrors disposed at the input end of the waveguides.

5. The optical waveguide coupler of claim 1 further comprising the waveguide mirror and the tapered waveguide molded simultaneously.

6. A method for interconnecting a plurality of electro-optical devices that transfer a photo-optic signal, comprising:

compression molding a three-dimensional tapered waveguide, having an input end and an output end and a first index of refraction, the waveguide configured to transmit a fundamental mode of the photo-optic signal from the input end to the output end in a transmission direction;

matching the input end of the waveguide with the optical mode profile of the electro- optical device that transmits the photo-optic signal at the input end;

matching the output end of the waveguide with the optical mode profile of the electro- optical device that receives the photo-optic signal at the output end of the waveguide;

coupling a structural member to the waveguide to physically support and the waveguide with the electro-optical devices; and simultaneously molding a waveguide mirror with the waveguide.

7. The method of claim 6, further comprising:

compression molding a plurality of waveguides, each of the waveguides having a respective input end and a respective output end, a first index of refraction and a configuration to adiabatically transmit the fundamental mode of the photo-optic signal from the input end to the output end in the transmission direction;

matching the input end of each waveguide with the optical mode profile of the electro-optical device that transmits the photo-optic signal at the input end of each of the waveguides; and matching the output end of each of the waveguides with the optical mode profile of the electro-optical device that receives the photo-optic signal at the output end of each waveguide within the plurality of waveguides.

8. An optical waveguide coupler for interconnection of a plurality of electro-optical devices that transfer a photo-optic signal, comprising;

at least one three-dimensional tapered waveguide, having an input end and an output end;

the waveguide configured to transmit the photo-optic signal from the input end to the output end in a transmission direction;

the input end of the waveguide matching the optical mode profile of the electro- optical device that transmits the photo-optic signal to the input end;

the output end of the waveguide matching the optical mode profile of the electro- optical device that receives the photo-optic signal from the output end of the waveguide;

a waveguide mirror disposed at the input end of the waveguide for use in directing the photo-optic signal to the electro-optical device that receives the photo-optic signal;

the waveguide mirror disposed at an angle of approximately forty-five degrees relative to the direction of transmission;

a structural member coupled to the waveguide; and the structural member physically supporting the waveguide for alignment of the waveguide with the electro-optical devices to be coupled.

* * * * *